United States Patent [19]

Jarwala et al.

[11] Patent Number: 5,027,353

[45] Date of Patent: Jun. 25, 1991

[54] METHOD FOR TESTING INTERCONNECTIONS

[75] Inventors: Najmi T. Jarwala, Plainsboro, N.J.; Chi W. Yau, Holland, Pa.

[73] Assignee: AT&T Bell Laboratories, Murray Hill, N.J.

[21] Appl. No.: 339,337

[22] Filed: Apr. 17, 1989

[51] Int. Cl.$^5$ .............................................. G06F 11/00
[52] U.S. Cl. ...................................................... 371/27
[58] Field of Search ...................... 371/27, 25.1, 22.3, 371/22.1, 22.2, 22.4, 22.5, 22.6, 21.3, 15.1; 324/73.1

[56] References Cited

PUBLICATIONS

H. Schnurmann, "Weighted Test Pattern Generation In Monte Carlo Testing of IC's", IBM TDB, vol. 15, No. 6, 11/1972, pp. 1725–1726.

"Test Generation of AC Faults Using Weighted Random Patterns", IBM IDB, vol. 32, No. 3A, 8/1989, pp. 4–6.

"Testing and Diagnosis of Interconnects Using Boundary Scan Architecture", A. Hassan, J. Rajski, and V. K. Agarwal, IEEE 1988 International Test Conference, Paper 7.1, pp. 126–137 (1988).

"Interconnect Testing with Boundary Scan", P. T. Wagner, IEEE 1987 International Test Conference, Paper 2.2, pp. 52–57 (1987).

"Electronic Chip-In-Place Test", P. Goel and M. T. McMahon, 1982 IEEE Test Conference, Paper 3.6, pp. 83–89 (1982).

"JTAG Boundary Scan Architecture Standard Proposal", Version 2.0, Joint Test Action Group, Mar. 30, 1988.

*Primary Examiner*—Jerry Smith
*Assistant Examiner*—Robert W. Beausoliel
*Attorney, Agent, or Firm*—R. B. Levy

[57] ABSTRACT

A set of test vectors for input to a circuit (10) to test the integrity of each of its n interconnections (nets) 16 is generated by first ordering the nets. Thereafter, the vectors are generated by assigning the bits of each vector associated with a given net a one or zero such that the vector has a minimum weight, as compared to the vectors assigned to successive nets. Alternatively, the test vectors can be generated by assigning the bits of selected groups of vectors a one or zero such that the groups of vectors each have minimum potential weight and the vectors in the group are independent of each other. The successive groups of vectors are then concatenated to yield the test vector set.

3 Claims, 2 Drawing Sheets

METHOD FOR TESTING INTERCONNECTIONS

TECHNICAL FIELD

This invention relates to a technique for generating a set of signals (test vectors) for input to a circuit to cause the circuit to generate a response signal indicative of the integrity of the interconnections therein.

BACKGROUND OF THE INVENTION

Each circuit on a printed wiring board is tested by applying a test signal to a first set of circuit nodes and then measuring the response at a second set of nodes, each connected to one of the first set along a circuit path. The circuit path between nodes typically includes a "net" which is defined as an equipotential surface (e.g., a metallized path on the board) which connects at least one signal transmitter ("driver") to at least one signal receiver ("receiver"). If the circuit is operating properly, i.e., the receivers and drivers are functioning properly and the nets are not shorted or open, then the response or signature of the circuit to the test signal should correspond to the test signal itself. On the other hand, if the circuit operation is faulty because two or more nets are shorted or one or more nets is open, then the circuit generates a signature which does not correspond to the test signal.

Typically, each test signal applied to the first set of circuit nodes usually takes the form of a parallel test vector comprised of n bits (ones or zeros), where n is the number of nets. Each of the bits in the test vector is applied to a separate one of the nodes in unison or parallel with the other bits, hence the reason for using the term parallel to describe the test vector. The particular sequences of the bits in the parallel test vectors is selected to reveal the shorts and opens among the nets as well as any "stuck-at" faults at the receivers or drivers. A stuck-at fault is present if the driver or receiver always produces a one or zero at its output regardless of whether a one or zero is at its inputs.

It is well known in the art that at least $\log(n)$ separate parallel test vectors are required to determine the integrity of the n nets. At least $\log(n+2)$ vectors are required if the stuck-at faults are to be detected as well. The reason for the additional two vectors is that detection of a stuck-at fault requires that both a zero and one must be applied (in sequence) to the net. A sequential test vector (as defined hereafter) which contains all zeroes or all ones will not satisfy this constraint.

A simple set of parallel test vectors, which will test the integrity of a set of n nets as well as the stuck-at faults, is given by the following matrix where each parallel test vector comprises a separate matrix column.

```
0...001
0...010
0...011
0...100
0...101
.......
.......
.......
```

Each row of the above matrix of parallel test vectors corresponds to a sequence of bits applied to each net over time. For this reason, each matrix row is often referred to as a sequential test vector. As may be appreciated, the sequential test vectors of this set monotonically increase in value; hence, the above set of parallel test vectors id described as a "counting" sequence.

The counting sequence of parallel test vectors, while compact in terms of the numbers of vectors it contains, does not afford good diagnostic capability. In other words, the response of the circuit following receipt of the parallel test vectors does not yield a good determination of which of the nets is open or shorted. In particular, the counting sequence of test vectors can give rise to two different types of incorrect responses, each defined as a "syndrome." The first type of syndrome, known as the "aliasing" syndrome, occurs when the response generated by a circuit having a faulty set of nets is the same as one having a fault-free set of nets, making it impossible to distinguish between them. The second type of syndrome is the "confounding" syndrome which occurs when the response of a circuit having only a single shorted net is the same as the response when several nets are shorted. These two syndromes are not mutually exclusive; both can occur.

The aliasing and confounding syndromes can be avoided by use of the "walking one" sequence of test vectors shown in matrix form below.

```
1 0 0 0 0 ... 0
0 1 0 0 0 ... 0
0 0 1 0 0 ... 0
0 0 0 1 0 ... 0
0 0 0 0 1 ... 0
. . . . . . . . . .
. . . . . . . . . .
. . . . . . . . . .
0 0 0 0 0 ... 1
```

As with the test vector matrix which produces the counting sequence, each column in the test vector matrix which produces the walking one sequence represents a parallel test vector of n bits whereas each row represents a sequential test vector of n bits. The reason why the sequence obtained by the above matrix is described by the term "walking one" is that the "1" shifts or walks from left to right from the first to the nth sequential test vector. An important attribute of the walking one sequence of test vectors is its property of diagonal independence, i.e., the sequence of bits along the matrix diagonal is all ones. This property allows the walking one sequence to completely diagnose all faulty nets.

The disadvantage of the walking one sequence is that n, rather than $\log(n+2)$ vectors are required, making this sequence very large. As a consequence, the amount f time required for testing is increased since a larger number of vectors must be input, in sequence, to the circuit.

Thus, there is a need for a technique for generating a reasonably compact set of test vectors which provides good diagnostic capability.

SUMMARY OF THE INVENTION

Briefly, the invention is directed to a technique for testing a circuit to verify the integrity of its n interconnections (nets) by sequentially applying each of a plurality of bits to each of the nets, and then detecting the response to each vector. Each of the sequential test vectors is generated by first selecting the number (p) of bits therein where $\log(n+2) \leq p \leq n$. The n nets are then ordered. Thereafter, a sequential test vector is established for each of the n ordered nets by setting each of the p bits to a one or zero so that the vector's weight (i.e., the number of ones) is no greater than the weight of the test vector assigned to the next ordered net.

By generating each sequential test vector such that its weight is no greater than that of the sequential vector assigned to the next ordered net, the likelihood of aliasing is reduced because, when a short occurs, the weight of the resultant response vector will be greater than the weight of the individual test vectors. In other words, the response vector contains more ones than any of the test vectors assigned to a particular net. (It is assumed that the effect of the short is to logically "OR" the individual signals as the shorted nets. By complimenting the test vector matrix, the case for shorts which are logically "ANDED" can be addressed.).

In accordance with another aspect of the invention, a matrix of test vectors which affords better diagnostic capability can be generated from a knowledge of how many adjacent nets are likely to be shorted together. To practice this technique, the nets int eh circuit are adjacency ordered such that the net $n_i$ is more adjacent to (i.e., is more likely to be shorted with) the net $n_{i+1}$ than with the net $n_{i+2}$. After the nets have been adjacency ordered, then the length p (the number of bits) of each of the sequential test vectors (i.e., the length of each row of vectors in the test vector matrix) is established to unambiguously verify the integrity of the n nets. In practice p can be given by E where E is the maximum number of adjacent nodes that may be shorted, using the following formula:

$$p = \begin{cases} E + \log(n + 1) - \log E - 1 & \text{if } E > 2 \text{ or } \log(n + 1) \neq \log(n + 1) \\ \log(n + 2) & \text{if } E = 2 \text{ and } \log(n + 1) = \log(n + 1) \end{cases} \quad (1)$$

Thereafter, the matrix of test vectors is established by first generating sets of unique sequential test vectors, each set comprised of a group of vectors which have the same potential weight and which are diagonally independent. The potential weight of the sequential test vector is given by $j-i+1$ and i and j are the lowest and highest order bits in the vector which are each a one, provided that $j-i+1>0$; otherwise the weight is zero. Once the sets of sequential test vectors are generated, the sets are concatenated, with each set having a successively larger potential weight, until the resultant set (matrix) has n rows.

An advantage of this method is that for each of the E nets, complete diagnostic capabilities are assured by the diagonal independence of the vectors applied thereto. Yet, the size of the overall vector set (the value of p) is less than n, making it compact.

DETAILED DESCRIPTION

Figure 1:
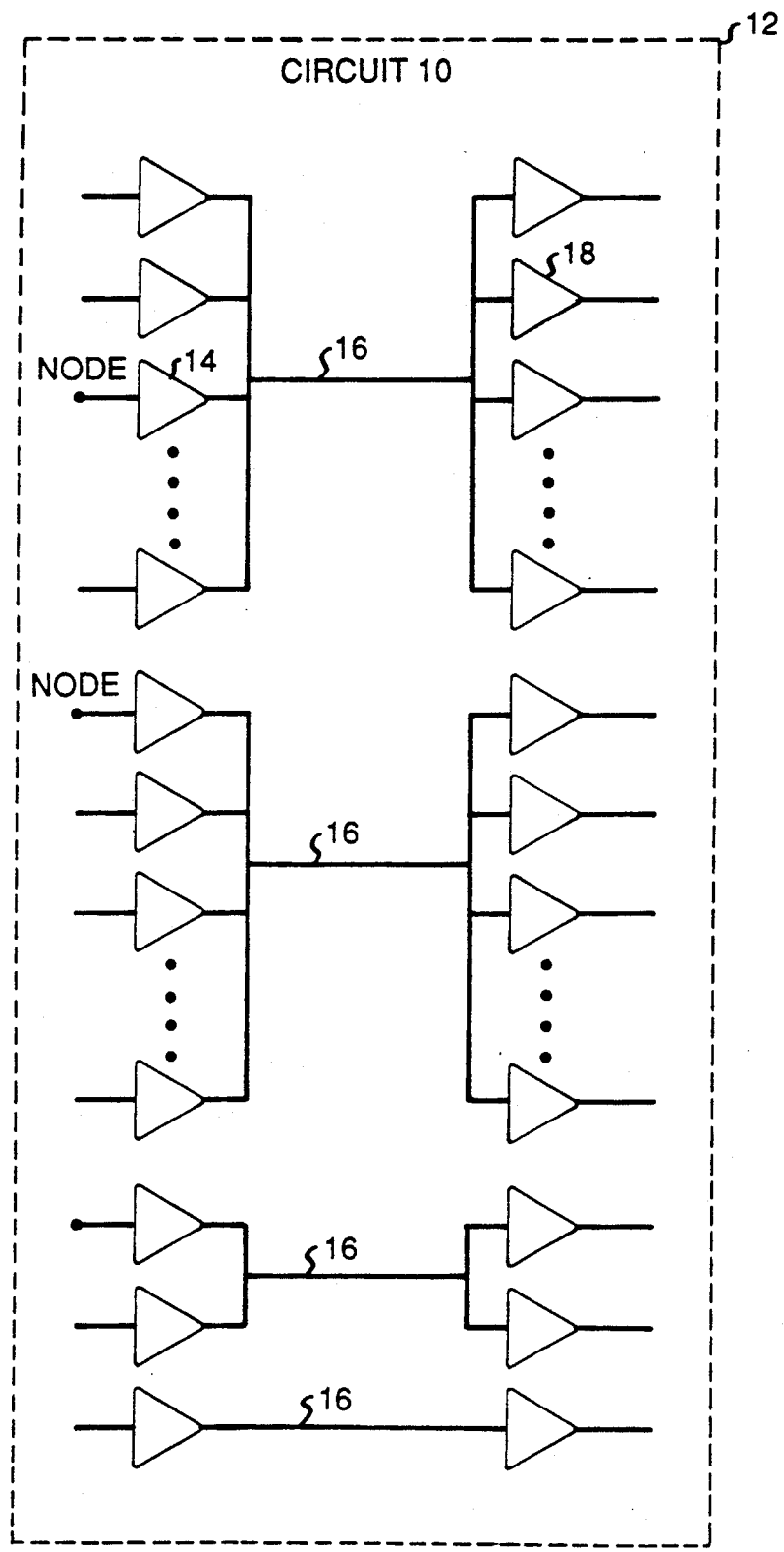
FIG. 1 is a simplified view of a prior art circuit containing a plurality of nets to be tested.

FIG. 1 is a block schematic diagram of a prior art circuit 10 which is carried on a circuit board 12 which may also carry other circuits (not shown). The circuit 10 is comprised of a plurality of signal-supplying elements ("drivers") 14, one or more of which are coupled in parallel by a separate one of a set of nets 16 to one or more of a set of signal-receiving elements ("receivers") 18. The nets 16, which are n in number (where n=4 in FIG. 1) each take the form of metallic path on the board 12, or a wire which is equipotential thereacross. In a preferred embodiment, the drivers 14 and the receivers 18 each take the form of a buffer.

Figure 2:
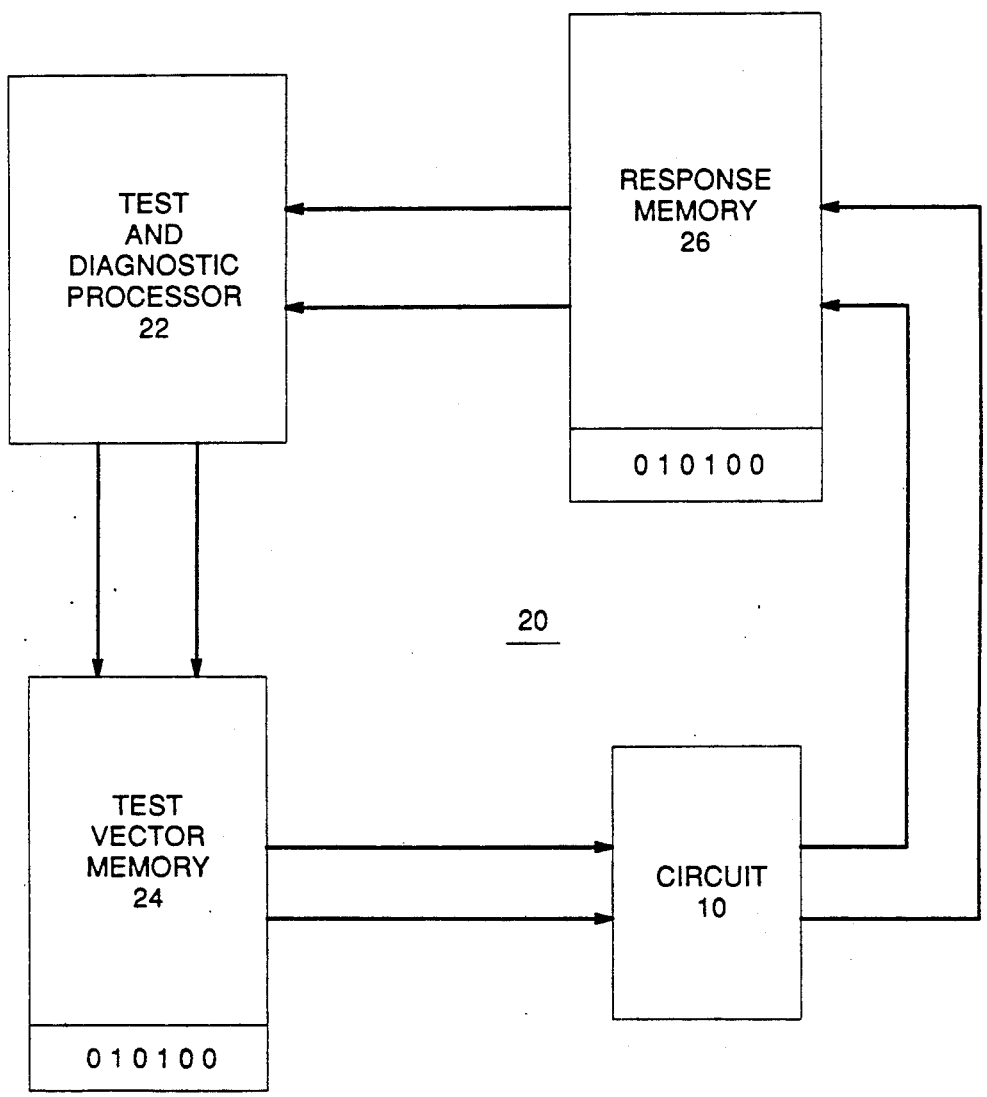
FIG. 2 is a block schematic diagram of a prior art test system.

The proper operation of the circuit 10 requires that each of the drivers 14 and the receivers 18 be functioning properly and that none of the nets 16 be open or shorted to each other. Referring now to FIG. 2, there is shown a prior art test system 20. The test system 20 comprises a test and diagnostic processor 22 which is coupled to memory 24 which stores a plurality of test signals, typically in the for of vectors which are input from the memory to the circuit 10. Upon receipt of each test signal, the circuit 10 produces a response signal which is indicative of the circuit operation. The response signals are stored in a memory 26.

The test vectors are each comprised of n bits (either a one or zero) which are applied in parallel to a first set of n nodes, each coupled (either directly, or through a receiver 14) to one end of a separate one of the nets 16. Since the bits of each test vector are applied in parallel, it is useful to describe the vectors as "parallel" vectors. When each parallel test vector is applied, the response signal appears at each of a second set of nodes, each coupled to the other end of a separate one of the nets 16. Like each test vector, each response signal comprises a vector of at least n bits which are each a one or zero. When the driver 14 and the receivers are operating correctly, and the nets 16 are fault-free (no shorts or opens), each bit in the response vector substantially mirrors or corresponds to a corresponding bit of the parallel test vector. On the other hand, if one of the n nets 16 is faulty, then the response signal will not correspond to the associated test vector.

The quality of the test depends on the n umber (p) of unique (different) parallel test vectors that are applied to the first set of nodes. It is known that log (n+2) unique parallel vectors will generally suffice to detect all faults. However, using a set of log (n+2) vectors, such as the set which yields the well-known counting sequence described at the outset of the specification, generally does not afford good diagnostic capability. In other words, this type of sequence does not afford the ability to differentiate between those responses (syndromes) which represent a faulty condition and one which is fault-free, nor the ability to detect whether one or ore of the nets 16 is shorted.

By employing n separate test vectors arranged in the walking one sequence described at the outset of the specification, a complete diagnosis can be had. As compared to the counting sequence, which requires log (n+2) parallel test vectors, the walking one sequence is much less compact (i.e., more parallel test vectors are required). In many instances, constraints are placed on the time required to test the circuit 10, often making it difficult to sequentially transmit n unique parallel test vectors. Thus, the process of constructing the test vectors applied to test the circuit 10 requires a trade-off between testing speed versus fault ambiguity (i.e., the ability to detect which nets are indeed faulty).

In accordance with the invention, a set of unique parallel test vectors, which is both compact and which provides lower fault ambiguity, can be obtained by generating n unique sequential test vectors which have a minimum weight (i.e., a minimum number of "one" bits. When referring to a set (matrix) of parallel test vectors, each row of the matrix represents a separate sequential test vector, i.e., the sequence of bits applied to a corresponding net 16 over time. The number of sequential test vectors (i.e., the number of matrix rows) is generally fixed at n, the number of nets 16.

On the other hand, the size (number of bits) of each sequential test vector is generally a variable, and will be represented by the letter p. The number (p) of parallel test vectors (i.e., the number of bits in each sequential test vector) depends on the desired level of fault ambiguity. By providing a greater number of parallel test vectors, the fault ambiguity becomes smaller, at the cost of increasing the length of the test. The instant technique does not fix the length of the sequential test vectors (i.e., the number p of parallel test vectors). Rather, the technique serves to improve diagnostic ability of the set of p parallel test vectors regardless of the value of p. Thus, the number p of parallel test vectors can be arbitrarily chosen, provided that $\log +2) \leq p \leq n$.

Once the desired number p of parallel test vectors is chosen, then the next step is to order the nets 16, i.e., assign a numerical value of identity to each one. For discussion purposes the nets 16 will be ordered $16_1, 16_2 \ldots 16_n$, respectively. The reason for ordering the nets 16 is to establish an order for the n sequential test vectors to be generated since each net has an associated sequential test vector. After ordering the nets 16, a unique sequential test vector is then generated and assigned to each of the nets such that the vector assigned to the net $16_i$ has a weight (a "ones" count) no greater than that of the vector assigned to the net $16_{i+1}$. The number of unique sequential test vectors that can have a given weight w is p. Thus, the maximum weight ($w_{max}$) of the assigned sequential test vectors will be given by the minimum of the $w_{max}$ for which the following is true:

$$\sum_{w_{max}}^{i=1} \binom{p}{i} \geq n \quad (2)$$

Actual generation of the independent sequential test vectors can be accomplished as follows:

(1) first, generate a sequential test vector of a minimum weight (initially equal to one);

(2) generate another sequential test vector of a minimum weight which is independent of (e.g., unique from) the previously generated vector(s);

(3) repeat step (2) until all unique sequential test vectors of the minimum weight are obtained;

(4) increase the minimum weight by 1;

(5) repeat the steps of (1)–(4) until n sequential test vectors are obtained.

Generation of the first initial test vector of the minimum weight of one is easily done by setting the first bit of an n bit vector to one while the rest of the bits are set at zero. Generating each of the next p−1 independent sequential vectors can be done by "walking a one" across the vectors. Walking a one across the vectors is accomplished by setting the next lower order bit (going from left to right) of each succeeding vector to a one with the other bits set to a zero.

To obtain the next set of unique sequential test vectors of the next higher weight, the highest order bit is held at a one and then a one is walked across the vectors. Thereafter, the next highest order bit is held at a one (the highest order bit now zero) and a one is again walked across the vectors. Each successively lower order bit is held at a one (the preceding bits being zero) and a one is walked across the vectors until all unique vectors at that weight are generated.

The next set of unique vectors, if they need to be generated, is produced in the same say except that the first and second highest order bits are held at a one, and then a one is walked across the vectors. Then the next two highest order bits are held at a zero in exactly the same way as before. For each set of vectors of the next higher weight, the number of the higher order bits held at a one is successively increased by 1.

A sample set of sequential test vectors produced by the technique is reproduced below.

TABLE 1

| Nets | p-Bit STVs | | | | Weights |
|---|---|---|---|---|---|
| $16_1$ | 1 | 0 | 0 | 0 | 1 |
| $16_2$ | 0 | 1 | 0 | 0 | 1 |
| $16_3$ | 0 | 0 | 1 | 0 | 1 |
| $16_4$ | 0 | 0 | 0 | 1 | 1 |
| $16_5$ | 1 | 1 | 0 | 0 | 2 |
| $16_6$ | 1 | 0 | 1 | 0 | 2 |
| $16_7$ | 1 | 0 | 0 | 1 | 2 |
| $16_8$ | 0 | 1 | 1 | 0 | 2 |
| $16_9$ | 0 | 1 | 0 | 1 | 2 |
| $16_{10}$ | 0 | 0 | 1 | 1 | 2 |
| $16_{11}$ | 1 | 1 | 1 | 0 | 3 |
| $16_{12}$ | 1 | 1 | 0 | 1 | 3 |

The vectors in the above table are less likely to give rise to an aliasing than the counting sequence of vectors because the weight of the response vector which is produced when a given pair of the nets $16_1, 16_2 \ldots 16_n$ is shorted is far greater than the weight of the test vectors associated with each net.

In accordance with another aspect of the invention, a set of parallel test vectors can be produced having even further reduced diagnostic ambiguity when the maximum size or number of adjacent nets 16 which can be shorted is known. As may be appreciated, the most common way of two or more nets 16 of the circuit 10 on the board 12 are shorted is when a blob of solder (not shown) falls on them. Generally such blobs are not very large (on the other of a few centimeters at best) and only a small fraction of the nets 16 of the circuit 10 on the board 12 is spaced a distance apart smaller than the diameter of the solder blob. Thus, the maximum number (E) of the shorted nets 16 is usually only a small percentage of the total number of nets n.

In order to obtain such a set of parallel test vectors, it is first necessary to "adjacency-order" the nets 16. The nets 16 are said to be adjacency ordered when the net $16_i$ is more likely to be shorted to the net $16_{i+1}$ than to $16_{i+2}$ for $1 \leq i \leq n-2$ and that $16_i$ is more likely to be shorted to $16_{i-1}$ than $16_{i-2}$ for $3 \leq i \leq n$. For discussion purposes, it will be assumed that when the nets 16 are ordered at $16_i, 16_2 \ldots 16_n$, they are adjacency ordered.

Once the nets have been adjacency ordered, the next step is to establish the minimum number of p vectors in the set, given that the maximum number of shorted nets 16 is E. The value of p can be established from the following relationship:

$$p = \begin{cases} E + \log(n + 1) - \log E - 1 & \text{if } E > 2 \text{ or } \log(n + 1) \neq \log(n + 1) \\ \log(n + 2) & \text{if } E = 2 \text{ and } \log(n + 1) = \log(n + 1) \end{cases} \quad (3)$$

After p has been established, then sets of unique sequential test vectors, having successively increasing potential weight, are generated and thereafter concatenated to yield the desired set of vectors. To understand how this is done, the term "potential weight" must be defined. The potential weight w of a vector is equal to $j-i+1$ where i and j are the lowest and highest order one bits if the vector's weight (number of ones) is greater than zero; otherwise w is zero. As an example, each of the vectors (0,1,1,1,0) and (0,1,0,1,0) have a potential weight of 3.

To obtain the set of n sequential test vectors, the following method is employed:

(1) establish the minimum potential weight (initially set to 1);

(2) starting with the first net ($16_1$), sequentially generate a unique vector of the minimum potential weight and assign it to each of the nets 16 in order of their adjacency until all the unique vectors of the same potential weight are generated (typically p for the first set);

(3) concatenate the vectors just produced with those previously produced;

(4) increase the minimum potential w weight by 1;

(5) repeat steps (1)–(4) until n vectors have been produced. For each successive set of vectors of potential weight w after the first set, there will be $2^{2-2}$ sets of vectors each containing $p - + 1$ sequential vectors. Each set of $p-w+2$ vectors is diagonally independent.

The vectors in each of the sets are generated as follows: The vectors in the first set are obtained by setting the highest order bit of the first vector to a "one" and then walking a one across the vectors until all the of p vectors of the set are obtained. The vectors of the next set are obtained by setting the first and second highest order bits equal to one and then walking not just a single one, but the block of ones across the vectors until $2^{w-2}$ $(p-w+1)$ vectors are obtained where w is the potential weight. For the next set, the first and third highest order bits of the first vector are set to a one with the intermediate value set to x where x {0,1}. Each unique block of 1, x,1 is walked across the vectors in succession. For each succeeding set, the initial block has additional intermediate order bit set to x, so that the blocks which are subsequently walked across the vector increase as 1,x,x,1 1, x,x,x,1 etc.

The table listed below contains a set of sequential test vectors produced by the above-described steps, for the condition p=4 and n=12.

TABLE 2

| Adjacency Ordered Nets | STVs (p bits) | | | | Potential Weights |
|---|---|---|---|---|---|
| $16_1$ | 1 | 0 | 0 | 0 | 1 |
| $16_2$ | 0 | 1 | 0 | 0 | 1 |
| $16_3$ | 0 | 0 | 1 | 0 | 1 |
| $16_4$ | 0 | 0 | 0 | 1 | 1 |
| $16_5$ | 1 | 1 | 0 | 0 | 2 |
| $16_6$ | 0 | 1 | 1 | 0 | 2 |
| $16_7$ | 0 | 0 | 1 | 1 | 2 |
| $16_8$ | 1 | 0 | 1 | 0 | 3 |
| $16_9$ | 0 | 1 | 0 | 1 | 3 |
| $16_{10}$ | 1 | 1 | 1 | 0 | 3 |
| $16_{11}$ | 0 | 1 | 1 | 1 | 3 |

TABLE 2-continued

| Adjacency Ordered Nets | STVs (p bits) | | | | Potential Weights |
|---|---|---|---|---|---|
| $16_{12}$ | 1 | 0 | 0 | 1 | 4 |

Any consecutive E vectors in the matrix have the property of diagonal independence. Diagonal independence is defined such that a diagonally independent matrix A of size $M \times N (N \geq M)$ enjoys the property that through some row and/or column interchange $A_{ij}$, the J-th entry in the i-th row is equal to:

$$a_{ij} = \begin{cases} 1 & \text{for all } i = j \\ 0 & \text{for all } i > j \\ x & \text{for all } i < j \end{cases}$$

where $1 \leq i \leq M$ $1 \leq j \leq N$ $x \in \{0,1\}$

Test vectors are diagonally independent will always produce responses (syndromes) which are never aliasing or confounding.

We claim:

1. A method for testing the integrity of each of n interconnections (nets) within a circuit of supplying each of a sequence of p parallel test vectors to the circuit and comparing the response signal produced by the circuit upon receipt of each test vector, the improvement comprising generating the set of vectors by the steps of:

ordering the n nets in the circuit;

generating a vector of p bits for each net, the p bits being selected as a one or zero as required so that the weight or potential weight of the vector assigned to each net has a weight or potential weight no greater than the one assigned to the next ordered net.

2. The method according to claim 1 wherein the test vectors are obtained by the steps of:

(a) generating a first sequential test vector of a minimum weight which is initially equal to one;

(b) generating another sequential test vector which is of the minimum weight and which is unique as compared to the previously generated vector(s);

(c) repeat step (b) until all unique sequential test vectors of the same minimum weight are obtained;

(d) increase the minimum weight by 1;

(e) repeat the steps of (a)–(d) until n sequential test vectors are obtained.

3. A method for testing the integrity of each n interconnections (nets) within a circuit by supplying each of a sequence of p parallel test vectors to the circuit and comparing the response signal produced by the circuit upon receipt of each test vector, the improvement comprising generating the set of vectors by the steps of:

ordering the nest in the circuit in such a way that net $n_i$ is closer in proximity to net $n_{i+1}$ than net $n_{i+2}$;

determining the maximum number (E) of adjacent nets likely to be shorted;

establishing the number p of vectors in accordance with the maximum number (E) of shorted nets;

successively producing set of unique test vectors, each of the vectors in each set obtained by assigning each of its p bits a one or zero such that all of the vectors in the set have a potential weight less than those in the succeeding set and that the vectors in each set are diagonally independent, and concatenating the set of p vectors together until n vectors are obtained.

* * * * *

UNITED STATES PATENT AND TRADEMARK OFFICE
CERTIFICATE OF CORRECTION

PATENT NO. : 5,027,353
DATED : June 25, 1991
INVENTOR(S) : N. T. Jarwala, C. W. Yau It is certified that error appears in the above-identified patent and that said Letters Patent is hereby corrected as shown below:

ON THE TITLE PAGE:

References Cited, line 5, "IBM IDB" should read --IBM TDB--.

Column 1, line 28, "Typically," should read --Typically,--.

Left and right "ceiling" symbols have been omitted throughout the specification:

Column 1, line 41, "log(n)" should read --$\lceil \log(n) \rceil$--.

Column 1, line 43, "log (n+2)" should read --$\lceil \log(n+2) \rceil$--.

Column 2, line 50, "log (n+2)" should read --$\lceil \log(n+2) \rceil$--.

Column 2, line 66, "log (n+2)" should read --$\lceil \log(n+2) \rceil$--.

Column 3, line 33,

"E + log (n+1) - log E - 1 if E > 2 or log (n+1) ≠ log (n+1)" should read

--$\lceil E + \log(n+1) - \log E - 1 \rceil$ if E > 2 or log (n+1) ≠ $\lceil \log(n+1) \rceil$--.

Column 3, line 34,

"log (n+2) if E = 2 and log (n+1) = log (n+1)" should read

--$\lceil \log(n+2) \rceil$ if E = 2 and log (n+1) = $\lceil \log(n+1) \rceil$ --.

UNITED STATES PATENT AND TRADEMARK OFFICE
CERTIFICATE OF CORRECTION

PATENT NO. : 5,027,353
DATED : June 25, 1991
INVENTOR(S) : N. T. Jarwala, C. W. Yau It is certified that error appears in the above—identified patent and that said Letters Patent is hereby corrected as shown below:

Column 4, lines 45-46, "log (n+2)" should read --$\lceil \log (n+2) \rceil$--.

Column 4, lines 47-48, "log (n+2)" should read --$\lceil \log (n+2) \rceil$--.

Column 4, lines 59-60, "log (n+2)" should read --$\lceil \log (n+2) \rceil$--.

Column 5, line 26, "log +2)" should read --$\lceil \log (n+2) \rceil$--.

Column 7, line 2,

"E + log (n+1) - log E - 1 if E > 2 or log (N+1) ≠ log (n+1)" should read

--$\lceil$ E + log (n+1) - log E - 1 $\rceil$ if E > 2 or log (n+1) = $\lceil$ log (n+1) $\rceil$--.

Column 7, line 2,

"log (n+2) if E = 2 and log (n+1) = log (n+1)" should read

--$\lceil$ log (n+2) $\rceil$ if E = 2 and log (n+1) = $\lceil$ log (n+1) $\rceil$--.

Column 2, line 2, "id" should read --is--.

Column 2, line 4, "numbers" should read --number--.

Column 3, line 14, "as" should read --at--.

UNITED STATES PATENT AND TRADEMARK OFFICE
CERTIFICATE OF CORRECTION

PATENT NO. : 5,027,353
DATED : June 25, 1991
INVENTOR(S) : N. T. Jarwala, C. W. Yau It is certified that error appears in the above—identified patent and that said Letters Patent is hereby corrected as shown below:

Column 3, line 21, "int eh" should read --in the--.

Column 3, line 42, "and" first occurrence should read --where--.

Column 4, line 13, "for" should read --form--.

Column 4, line 43, "n umber" should read --number--.

Column 5, line 29, "of" should read --or--.

Column 6, line 50, "other" should read --order--.

Column 7, line 32, "$2^{2-2}$" should read --$2^{w-2}$--.

Column 7, line 33, "p - + 1" should read --p - w + 1--.

Column 7, line 50, "bit" should read --bits--.

Column 8, line 40, claim 1, "of" should read --by--.

Column 8, line 65, claim 3, "each n" should read --each of n--.

UNITED STATES PATENT AND TRADEMARK OFFICE
CERTIFICATE OF CORRECTION

PATENT NO. : 5,027,353

DATED : June 25, 1991

INVENTOR(S) : N.T. Jarwala, et al.

It is certified that error appears in the above-identified patent and that said Letters Patent is hereby corrected as shown below:

Column 10, line 1, claim 3, "set" should read --sets--.

Signed and Sealed this

Tenth Day of November, 1992

Attest:

DOUGLAS B. COMER

Attesting Officer    Acting Commissioner of Patents and Trademarks